United States Patent [19]
Mason et al.

[11] Patent Number: 5,302,923
[45] Date of Patent: Apr. 12, 1994

[54] INTERCONNECTION PLATE HAVING HIGH FREQUENCY TRANSMISSION LINE THROUGH PATHS

[75] Inventors: Roy L. Mason, Lake Stevens; Paul A. Richer, Snohomish; James K. Pietsch, Edmonds, all of Wash.

[73] Assignee: Hewlett-Packard Company, Palo Alto, Calif.

[21] Appl. No.: 914,952

[22] Filed: Jul. 16, 1992

[51] Int. Cl.$^5$ .............................................. H01P 1/00
[52] U.S. Cl. ...................................... 333/33; 439/75; 333/260
[58] Field of Search ................... 333/32, 33, 246, 260; 361/395, 424, 414, 412, 396, 413; 174/35 R, 250, 35 C; 439/44, 45, 74, 75, 108, 109, 92

[56] References Cited

U.S. PATENT DOCUMENTS

| | | | |
|---|---|---|---|
| Re. 27,089 | 3/1971 | Sear et al. | 361/396 |
| 3,351,816 | 11/1967 | Sear et al. | 361/396 |
| 3,351,953 | 11/1967 | Sear | 361/396 |
| 4,390,221 | 6/1983 | Niles et al. | 439/75 |
| 4,736,266 | 4/1988 | Tanibe | 361/424 |
| 4,737,116 | 4/1988 | Slye et al. | 439/92 |
| 4,841,414 | 6/1989 | Hibino et al. | 361/424 |
| 4,939,624 | 7/1990 | August et al. | 361/424 |
| 4,994,771 | 2/1991 | Takamine et al. | 333/33 |
| 5,023,754 | 6/1991 | Aug et al. | 361/412 |
| 5,041,945 | 8/1991 | Suzuki | 361/424 |
| 5,101,322 | 3/1992 | Ghaem et al. | 361/424 |
| 5,107,404 | 4/1992 | Tam | 361/424 |
| 5,184,095 | 2/1993 | Hanz et al. | 333/33 |
| 5,211,567 | 5/1993 | Neumann et al. | 439/75 |
| 5,224,918 | 7/1993 | Neumann et al. | 439/74 |

*Primary Examiner*—Raymond A. Nelli

[57] ABSTRACT

An interconnection plate apparatus provides high frequency signal paths for communication among multiple pc boards and/or high frequency system components. The apparatus includes an interconnection plate which is a conductor having cross-sectional channels at which transmission line structures are formed. The transmission line structure includes a through-plate conductor concentrically surrounded by a through-plate insulator concentrically surrounded by the channel walls. An RF ground ring is positioned between the interconnection plate and a pc board at the transmission line structure. The interconnection plate provides a common ground reference and a common ground path for each board mounted to the interconnection plate. The ground ring structures assure a stable ground connection between the interconnection plate and the pc board ground planes. Different transmission line structures implement different signal transformation functions. The transmission line structure may simply pass the signal. In one embodiment, however, the transmission line structure serves as a low-pass filter.

17 Claims, 4 Drawing Sheets

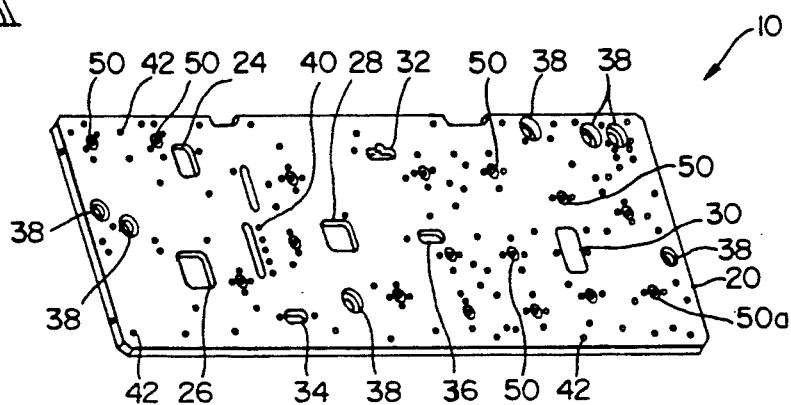
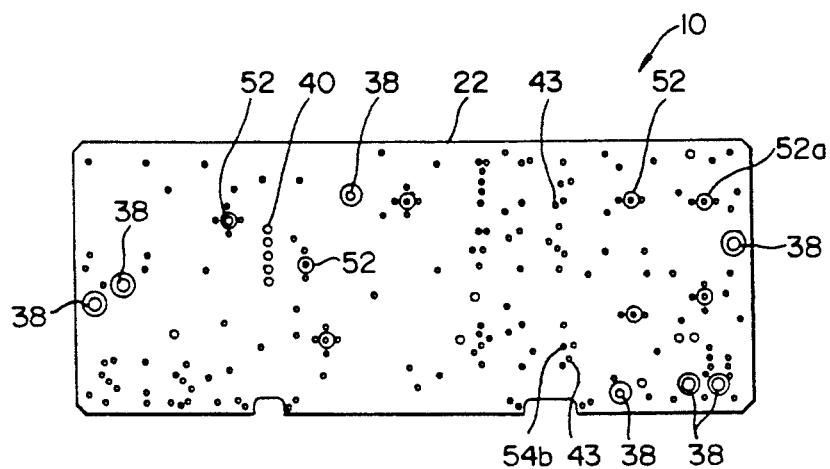
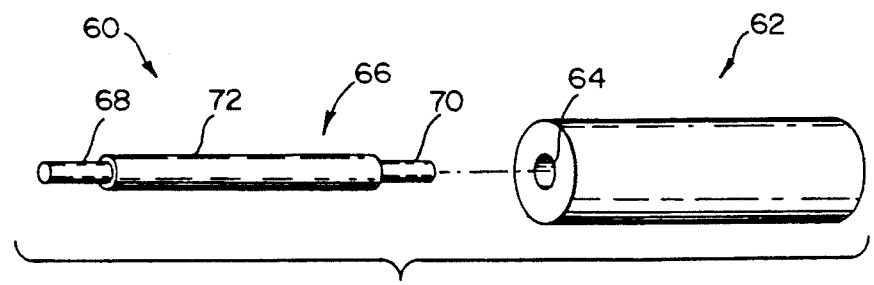
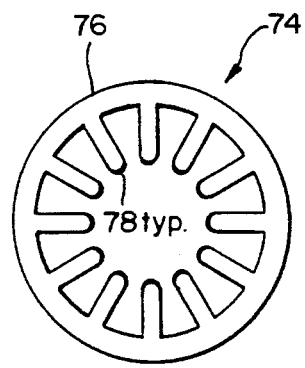

INTERCONNECTION PLATE HAVING HIGH FREQUENCY TRANSMISSION LINE THROUGH PATHS

BACKGROUND OF THE INVENTION

This invention relates to off-board communication path structures for high frequency signal transmissions. More particularly, this invention relates to an interconnection plate between pc boards in which a high frequency transmission line structure is formed through a cross-section of the plate.

Communication paths for high frequency signals in the gigahertz range are often designed to minimize signal reflection at path media transitions. Signal reflection is undesirable as the signal is attenuated resulting in power loss. Accordingly, it is well known to match impedances among different media forming a high frequency signal path. In particular, impedance-matched transmission line structures are formed for on-board and off-board communications. Of interest here are path structures for off-board communication.

Conventional off-board communication path structures achieving transmission line effects for high frequency signals include semi-rigid cable assemblies. A semi-rigid cable assembly includes an outer semi-rigid metal tube concentrically surrounding an insulator concentrically surrounding a central coaxial conductor. Typically, the cable assembly is terminated with a pair of mating connectors, one of which is attached to the semi-rigid cable and the other soldered to the pc board.

Such cable assemblies are bulky, awkward structures. Packaging of systems employing these assemblies require excess space for routing each cable. To reduce the associated packaging, fabrication and assembly costs, a less spacious, more compatibly-shaped structure is desired. A high frequency signal path structure is needed which achieves transmission line effects at a lower cost.

SUMMARY OF THE INVENTION

According to the invention, an interconnection plate apparatus provides high frequency signal paths for communication among multiple pc boards and/or high frequency system components. The interconnection plate is a conductor having cross-sectional channels concentrically receiving through-plate insulators and through-plate conductors. Each through-plate conductor serves as a signal path between pc boards and/or components mounted on opposite sides of the interconnection plate.

According to one aspect of the invention, a transmission line structure is formed at a cross-sectional channel of the interconnection plate. The transmission line structure includes a through-plate conductor concentrically surrounded by a through-plate insulator concentrically surrounded by walls of the conductive interconnection plate. Such transmission line has an impedance matched to a standard impedance (i.e., 50 ohms) for the system in which the interconnection plate is implemented.

According to another aspect of the invention, an RF ground ring is positioned between the interconnection plate and a pc board at the transmission line structure. The ground ring includes multiple fingers extending radially inward. Each finger is ridged to protrude out of the plane of the ring. When the ground ring is pressed between the interconnection plate and pc board the ridges are forced toward the plane of the ring. As a result, at each finger there is pressure outward in one direction toward the pc board and outward in an opposite direction toward the interconnection plate. The ground ring provides a reliable, repeatable physical contact between the interconnection plate and the pc board in close proximity to the through-plate conductor.

According to another aspect of the invention, the interconnection plate serves as a common ground path for ground planes at each pc board coupled to the plate. Each pc board has a ground plane undersurface in contact with the interconnection plate. The plate in turn is connected to a system ground. Thus, the interconnection plate provides a common ground reference and a common ground path for each board mounted to the interconnection plate. The ground ring structures, as described above, assure a stable RF ground connection between the interconnection plate and the pc board ground planes.

According to another aspect of the invention, different transmission line structures are employed for implementing different signal transformation functions. The transmission line structure may simply pass the signal. In one embodiment, however, the transmission line structure serves as a low-pass filter.

According to one embodiment, multiple interconnection plates are used in a spectrum analyzer. Each plate receives pc boards and/or components which form subsystems of the spectrum analyzer. Multiple plates are arranged in a chassis and coupled through cable assemblies for off-plate communication. In addition, each plate is coupled to a common system ground. Each plate serves as a ground reference and a common ground path for pc boards and components mounted to it.

Advantages of the interconnection plate assembly include reduced fabrication, material and assembly costs relative to conventional semi-rigid cable assembly costs. Also, a reliable ground connection is achieved which minimizes signal attenuation at communication interfaces.

The invention will be better understood by reference to the following detailed description taken in conjunction with the accompanying drawings.

BRIEF DESCRIPTION OF THE DRAWINGS

FIGS. 2A and 2B are a perspective front and a plane back view of a bare interconnection plate of FIG. 1.

FIG. 3 is an exploded view of a pin assembly received into the plate of FIGS. 1 and 2 forming part of a transmission line signal path between pc boards.

FIG. 4 is a plane view of a ground ring according to an embodiment of this invention.

DESCRIPTION OF SPECIFIC EMBODIMENTS

Overview

Figure 1:
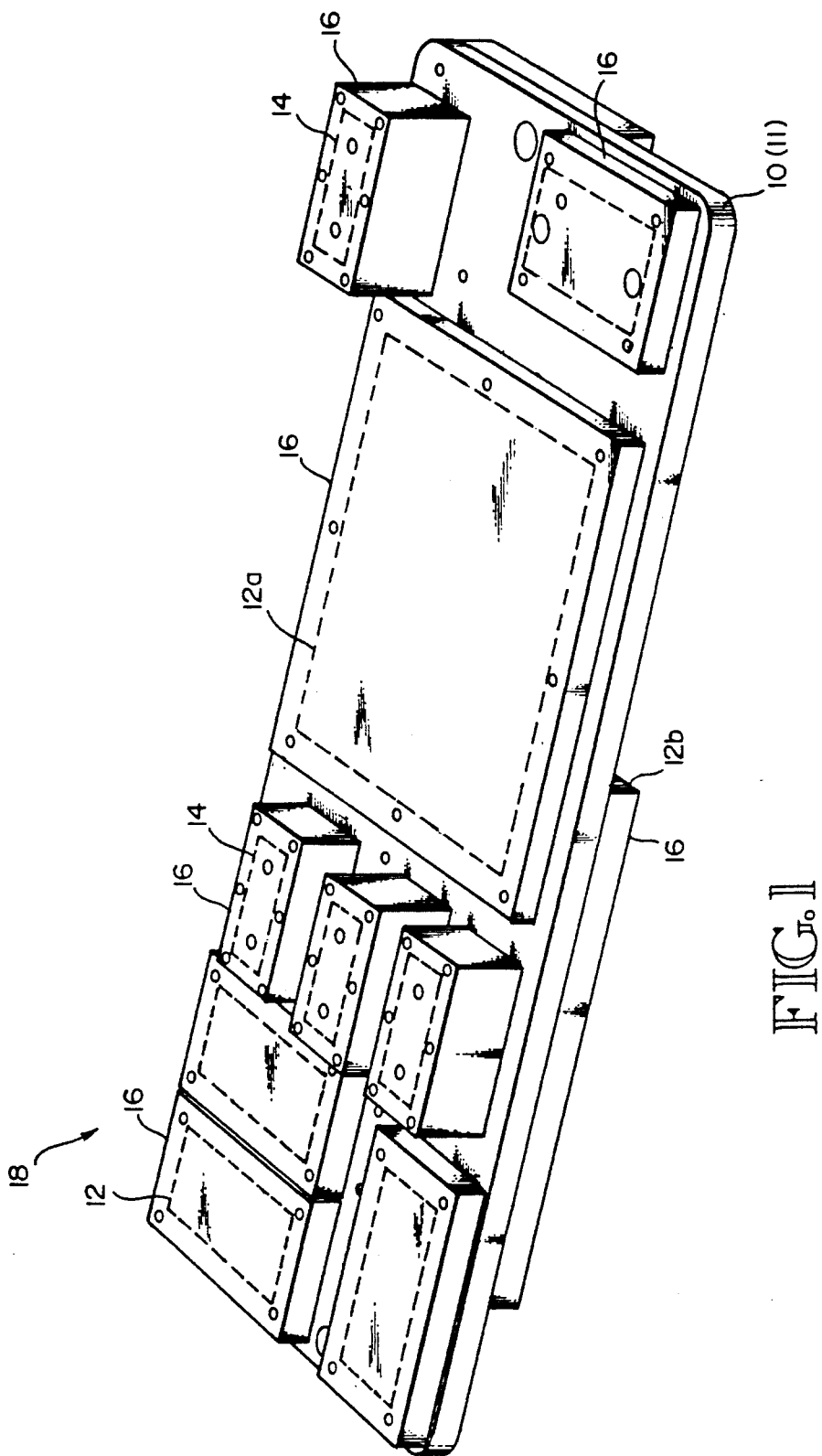
FIG. 1 is a perspective view of an interconnection plate assembly with mounted pc boards, system components and shielding enclosures according to an embodiment of this invention.

FIG. 1 shows a perspective view of an interconnection plate assembly 10 with mounted pc boards 12, system components 14 and shielding enclosures 16 according to an embodiment of this invention. The system components 14 include band pass filters, attenuators, amplifiers or other components. In one embodiment, the plate assembly 10 and mounted parts 12, 14, 16 form a subassembly 18 within a spectrum analyzer which processes signals in the gigahertz frequency range. Multiple subassemblies are electrically connected within a chassis (not shown) through semi-rigid cable assemblies (not shown) to form the spectrum analyzer.

The interconnection plate assembly 10 of each subassembly 18 provides a low cost, alternative signal path structure for inter-board high frequency communication. The interconnection plate assembly includes a conductive plate 11 having openings and channels into which pin assemblies, dc connectors, bulkhead connectors, and alignment pins are received. The conductive plate 11 has a fixed shape which enables a logical system architecture of pc boards 12 and components 14 grouped into subassemblies 18.

Each interconnection plate is a conductor serving as a common ground path for mounted parts 12, 14. Each interconnection plate assembly 10 forms multiple signal paths for communication between pc boards 12 and mounted components 14. In particular, a terminal at pc board 12 or component 14 mounted at one surface of the interconnection plate 11 is directly coupled to a terminal at another pc board 12 or component mounted to the opposite surface of the interconnection plate 11.

To achieve minimal signal reflection across the plate assembly, the signal paths are formed as transmission line structures. Such structures match the standard impedance of the system in which subassemblies 18 are included. As a result, power loss at path interfaces is minimized.

The interconnection plate assembly 10 includes a conductive plate 11 (FIG. 2), pin assemblies 60 (FIG. 3, 7 and 8) and RF ground rings 74 (FIG. 4). Other components such as cable connectors, dc contacts, and alignment pins (not shown) also are included. Following is a discussion of the conductive plate 11, pin assemblies 60 and ground rings 74.

Conductive Plate 11

FIGS. 2a-b show alternate views of a bare interconnection plate 11 without other plate assembly 10 components and without mounted boards 12 or system components 14. In one embodiment the conductive plate 11 is formed as a solid, integral aluminum structure having two elongated surfaces 20, 22. A variety of openings, recessed areas and through channels are formed on the conductive plate 11 according to the particular embodiment of subassembly 18.

As shown in FIG. 2a recessed areas 24-36 are formed at surface 20. Each recessed area 24-36 provides an air space adjacent to a pc board 12. Typically the pc board 12 has a conductive ground plane at the undersurface 102 in contact with the plate 11 (See FIG. 6). The pc board may have areas at the undersurface 102 in which the ground plane is not present. For example, the pc board may include a balun component printed onto the pc board metalization. Also, the pc board may have a through component. The air space at plate 11 adjacent to the non-ground plane undersurface minimizes or avoids unwanted capacitance between the conductive plate 11 and the pc board 12. Similar openings 24-36 may appear on either surface 20, 22 of conductive plate 11, although in the embodiment shown such areas appear only at surface 20.

Openings 38 formed at both surfaces 20, 22 serve as bulkhead connector mounts for receiving semi-rigid cable assemblies (not shown). The cable assemblies serve as off-plate and inter-subassembly communication path structures of conventional design. Channels 40 serve as openings for receiving dc connectors (not shown). Channels 42 serve as openings for receiving screws or other fastening mechanisms which hold a pc board 12, component 14 or shield enclosure 16 to the plate 11. Channels 43 serve as openings for receiving alignment pins for system components 14.

According to one aspect of the invention, the plate 11 includes multiple recessed areas 50, 52. Each such area 50, 52 has a central through-channel 53 (see FIG. 6) between surfaces 20, 22. The channels 53 are defined by walls of the conductive plate 11 and are used for forming a communication path structure between pc boards 12 and/or system components 14. For a communication path between pc boards 12, a first recessed area 50a at surface 20 (see FIG. 2a) has a central channel passing through to a second recessed area 52a at surface 22 (see FIG. 2b). For a communication path between a pc board 12 at surface 20 and a system component 14 at surface 22, a first recessed area 50 at surface 20 (see FIG. 2a) has a central channel passing through to an opening 54b at surface 22 (see FIG. 2b).

Pin Assembly 60

FIG. 3 shows an exploded view of a pin assembly 60 for electrically coupling pc boards 12a, 12b mounted to opposite surfaces 20, 22 of the conductive plate 11. The pin assembly 60 includes an outer insulator 62 having a central channel 64 receiving a conductor pin 66. The pin 66 includes protrusions 68, 70 which extend from each side of the insulator 62. In one embodiment, the extended protrusions 68, 70 have a diameter less than the pin diameter at the portion 72 received within insulator channel 64. The protrusions 68, 70 serve as posts to which a signal connection is made with a transmission line strip on an adjacent pc board 12. In one embodiment the insulator 62 is formed by a teflon material, while the conductor pin 66 is formed with gold-plated brass.

RF Ground Ring 74

Figure 5A:
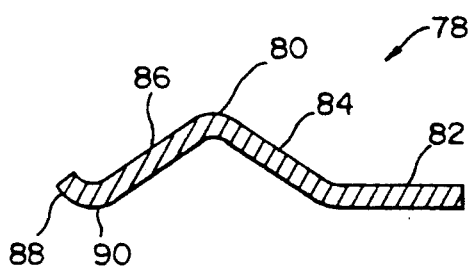
FIGS. 5A and 5B are alternate views of a finger of the ground ring of FIG. 4.

FIG. 4 shows a plane view of an RF ground ring 74 received into a first recessed area 50 or a second recessed area 52 of conductive plate 11. The ground ring 74 is a conductor integrally formed as an outer ring 76 having multiple inwardly extending fingers 78. In one embodiment, the ground ring material is tin plated beryllium copper. Each finger 78 has a relaxed state as shown in FIG. 5a in which a ridge 80 protrudes out of a plane of the outer ring 76. When pressed between a pc board 12 and the plate 11, the finger 78 is forced into an unrelaxed state shown in FIG. 5b. In the unrelaxed state, the finger 78 extends farther toward the ring center as the ridge 80 is forced down toward the plane of the ring 76. In one embodiment, each finger 78 includes a first portion 82 extending inward from the outer ring 76 and leading to a second portion 84. The second portion 84 bends out of the plane of the ring 76. The second portion 84 meets a third portion 86 at ridge 80, and extends back toward to the plane of the outer ring 76. The third portion 86 meets a fourth portion 88 which bends again to form a contact surface 90. Each finger defines two contact points on opposite surfaces. One contact point is in physical communication with the plate 11. The other contact point is in physical communication with a pc board 12. In one embodiment, twelve fingers 78 are included. As a result, multiple points of contact are provided to the plate and pc board 12. Thus, if physical communication at one or more contacts is lost due to contamination, there are still several other contacts maintaining physical communication.

The ground ring 74 provides a reliable, repeatable contact between a pc board 12 and plate 11. Thus, the subassembly can be taken apart and reconstructed with the ground ring 74 still providing a reliable contact.

Transmission Line Structure

Figure 6:
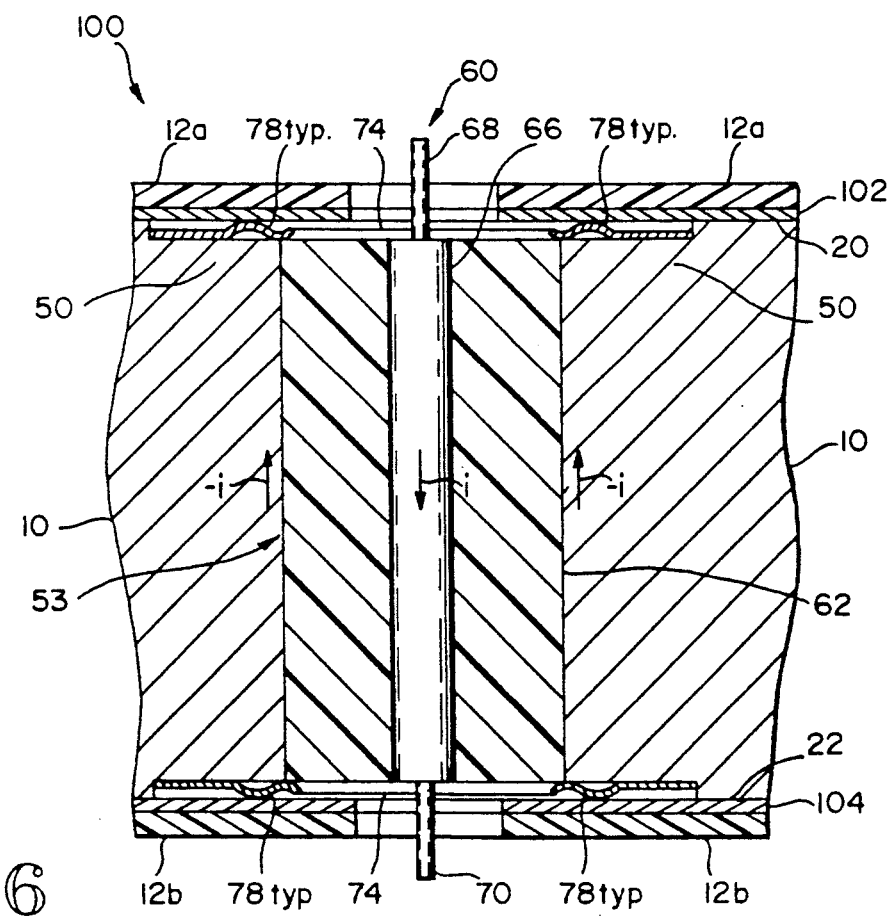
FIG. 6 is a cross-sectional view of a portion of the plate of FIGS. 1 and 2 in the area where the pin assembly of FIG. 3 and ground ring of FIG. 4 are received.

FIG. 6 shows the transmission line structure 100 formed by the pin assembly 60, two ground rings 74 and plate 11 for connecting two pc boards 12a, 12b. As described above, plate 11 has a first recessed area 50 at surface 20 and a second recessed area 52 at surface 22 (see FIGS. 2). A central through-channel 53 connects the two recessed areas 50, 52. The pin assembly 60 is received into the channel 53, and ground rings 74 are received into each recessed area 50, 52. A pc board 12a is connected to the plate 11 at surface 20 with the pin protrusion 68 extending to the pc board 12a for connection. Similarly a pc board 12b is connected to the plate 11 at surface 22 with the pin protrusion 70 extending to the pc board 12b for connection. The pin 66, insulator 62 and the plate 11 walls defining channel 53 form the transmission line structure 100. The ground rings 74 also may be considered part of the transmission line structure.

In operation a high frequency signal having current i flows from a signal path on one pc board 12a to a signal path on the other pc board 12b via the central pin conductor 66. According to transmission line structures, a signal $-i$ flows along the walls of plate 10 that form channel 53. As signals at high frequency travel near the surface of a conductor, the current $-i$ stays close to the walls of channel 53 adjacent to insulator 62.

To minimize signal reflection at the interface between the signal path of one pc board 12 and the pin conductor 66, the transmission line structure 100 is impedance matched to the impedance of the transmission line on the pc board 12. In one spectrum analyzer embodiment, a standard impedance for signals is 50 ohms. Accordingly, the transmission line 100 geometry is formed to provide a 50 ohm structure. The geometry includes the size and shape of the channel 53, insulator 62 and conductor 66. In addition, the material composition of the insulator also effects the impedance. Thus, one could use the same plate with the same geometry for a different impedance by altering the material. Impedance matched transmission lines at the pc board and plate 11 result in minimal reflection at the line interfaces.

Figure 5B:
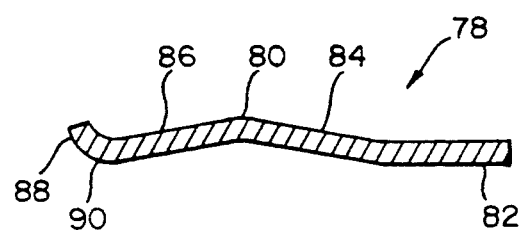

To minimize power loss the ground rings 74 provide reliable connections between the ground planes 102, 104 of the respective pc boards 12a, 12b and the plate 11 in close proximity to the central conductors 66. Referring to FIGS. 5b and 6, the finger ridges 80 of the ground ring 74 are pressed toward the plane of the ring 74, resulting in an outward force against the ground plane 102, 104 of the respective pc board 12a, 12b at ridges 80 and against the plate 10 at the contacts 90. Although such orientation is preferable, the placement of the rings 74 can be reversed so that the ridges 80 meet the plate 10 and the contacts 90 meet the pc board ground planes 102, 104.

Alternative Pin Assembly Embodiments

Figure 7:
FIG. 7 is a plane view of a pin assembly embodiment forming a signal path structure between a pc board and a band pass filter component.

FIG. 7 shows an alternative embodiment of the central pin conductor 66′ for a pin assembly 60 used for coupling a pc board 12 to a plate-mounted component 14 such as a band pass filter. The pin conductor 66′ has a protrusion 68′ for coupling to the pc board and a central portion 72′ received within insulator 62, as previously described. However, rather than have a second protrusion 70 for coupling to a second pc board, the pin conductor 66′ has an extended section 73 received into the band pass filter 14.

In one band pass filter embodiment, a ground plane does not contact the plate 10. As a result, a ground ring 74 is not used between the plate 10 and filter 14. Thus, the plate 10 does not include a recessed area 50, 52 on the side of the plate 10 adjacent to the filter.

Figure 8:
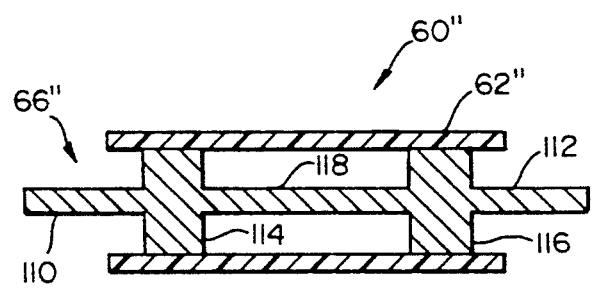
FIG. 8 is a plane view of a pin assembly embodiment forming a low pass filter structure.

FIG. 8 shows an alternate embodiment of a pin assembly 60″ forming a low pass filter. The pin assembly 60″ includes an insulator 62″ and a central pin conductor 66″ as does the pin assembly 60. The pin assembly 60″ has the same diameter as the pin assembly 60 fitting into the same channels 53 of plate 10. The internal geometries of the assemblies 60, 60″ differ, however, so that assembly 66″ embodies a low pass filter. In particular, the insulator 62″ has a wider central channel for receiving the central conductor 66″. The conductor 66″ has protrusions 110, 112 for coupling to respective pc boards 12a, 12b. The pin geometry within the insulator 62″, however, varies with distance. As a signal traverses the conductor 66″, the signal encounters large diameter area 114, then small diameter area 118, then large diameter area 116. In effect, a low pass filter circuit of two capacitors and a central inductor is formed. The characteristics of the filter may vary according to the embodiment. In one system embodiment in which signals of 1 to 6 gigahertz are processed, the low pass filter 60″ passes signals of less than 5 gigahertz unattenuated, while attenuating signals above 5 gigahertz. Such a low pass filter embodiment is useful at the output of a mixer element of a spectrum analyzer to filter out unwanted harmonics.

Physical Dimensions for a Specific Embodiment

In a specific embodiment the conductive plate 11 is formed with 9.5 mm solid aluminum stock. The first and second recessed areas 50, 52 are 0.25 mm deep with a 8.95 mm center bore. Central channel 53 has a 3 mm diameter. The pin assembly 60 includes a generally cylindrical insulator 62 which is 8.5 mm long, 3 mm in diameter with a 0.91 mm central channel. The pin 66 is a diameter of 0.91 mm in the area surrounded by insulator 62, while the protrusions 68, 70 have diameters of 0.51 mm. The wider diameter portion 72 of pin 66 is 9.08 mm long. Each protrusion 68, 70 is 2.04 mm long.

The ground ring 74 has an outer diameter of 0.304 inches. The outer ring has an inner diameter of 0.256 inches. The outer ring 76 and each finger 78 is 0.005 inches thick. Each finger 78 is 0.02 inches wide in arc along the outer ring 76. In the relaxed state, a finger 78 extends out of the plane of ring 76 to a height of 0.02 inches (including finger thickness). The second portion 84 extends 0.03 inches. The first and second portions 82, 84 extend 0.05 inches. The first, second and third portions extend 0.08 inches. The entire finger extends 0.09 inches. In an unformed state (prior to forming a ridge 80), the finger 78 extends 0.101 inches. In the unrelaxed state, the finger 78 is pressed to 0.01 inches (the depth of recessed area 50, 52).

For the low pass filter pin assembly 60", the insulator 62" is 0.335 inches long, has an outer diameter of 0.12 inches, and an inner diameter of 0.092 inches. The pin conductor is 0.475 inches long. The protrusions 110, 112 are 0.02 inches in diameter. The central portion 118 is 0.02 inches in diameter and extends 0.175 inches. The wide diameter portions 114, 116 are 0.05 inches long.

Concluding Remarks

Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. An interconnection assembly for high frequency transmission line communication in the gigahertz frequency range between a first pc board and either one of a second pc board and an electrical component, comprising:
   an integral conductive plate having first and second elongated surfaces, said first surface defining a first recessed area, the plate having a through-channel between said first recessed area and said second surface defined by plate walls;
   an insulating member received into said through-channel, the insulating member defining a central channel;
   a conductive member received into the central channel of the insulating member; and
   a first conductive ring received into said first recessed area for providing physical communication between the first pc board and the conductive plate; and
   wherein an undersurface of the first pc board is in contact with said first surface, and an undersurface of the one of the second pc board and electrical component is in contact with said second surface; and
   wherein said conductive member, insulating member and plate walls of said through channel form a transmission line with impedance matched to impedance of a signal path at said first pc board that is in communication with said conductive member, a first current travelling along said conductive member and an opposite ground current travelling along said plate walls; and
   wherein said first conductive ring receives said ground current and serves as a first ground current path from said plate walls to said first pc board, said first conductive ring minimizing differential in signal path length of said ground current relative to said first current at a junction between the transmission line and the signal path at the first pc board, said first ground current path minimizing power loss at said junction.

2. The apparatus of claim 1, in which said conductive plate serves as a common ground path for a ground plane at each pc board in contact with said first and second surfaces.

3. The apparatus of claim 1, in which said conductive plate serves as a ground reference plane for each pc board in contact with said first and second surfaces.

4. The apparatus of claim 1, wherein the first ring has a plurality of inwardly extending first radial fingers, each finger defining a first contact and a second contact, the first contact providing physical communication with the first pc board, the second contact providing physical communication with the conductive plate.

5. The assembly of claim 1, wherein geometries of the insulating member and conductive member define a low pass filter.

6. The assembly of claim 5, wherein the conductive member is a solid pin, comprising:
   first and second cylindrical end portions for coupling to the first pc board and the one of either a second pc board or component;
   first, second, and third cylindrical middle portions axially aligned between the respective end portions, the first and third middle portions positioned on opposite ends of the second middle portion, the first and third middle portions having a larger diameter than the first and second end portions and the second middle portion.

7. The assembly of claim 1, wherein each first radial finger extends along a first plane and bends out of the first plane to define the first contact and bends back from the first contact toward the first plane to define the second contact.

8. The assembly of claim 1, wherein said plate is uniformly conductive throughout the plate's volume.

9. An interconnection assembly for high frequency transmission line communication in the gigahertz frequency range between pc boards, comprising:
   an integral conductive plate having first and second elongated surfaces, the plate having a through-channel between said first and second surfaces defined by plate walls, the first surface having a first recessed area at said through channel, the second surface having a second recessed area at said through channel;
   an insulating member received into said through-channel, the insulating member defining a central channel;
   a conductive member received into the central channel of the insulating member;
   a first conductive ring received into said first recessed area, the first ring having a plurality of inwardly extending first radial fingers, a first radial finger having a ridge extending out of a plane defined by the ring;
   a second conductive ring received into said second recessed area, the second ring having a plurality of inwardly extending second radial fingers, a second radial finger having a ridge extending out of a plane defined by the ring;
   wherein an undersurface of a first pc board is in contact with said first surface and an undersurface of a second pc board is in contact with said second surface; and
   wherein said conductive member, insulating member and plate walls at said through channel form a transmission line with impedance matched to impedance of a signal path at said first pc board that is in communication with said conductive member, a first current travelling along said conductive member and an opposite ground current travelling along said plate walls; and wherein said first conductive ring receives said ground current and serves as a first ground current path from said plate walls to said first pc board, said first conductive ring minimizing differential in signal path length of said ground current relative to said first current at a junction between the transmission line and the signal path at the first pc board, said first ground current path minimizing power loss at said junction; and wherein said second conductive ring receives said ground current and serves as a second ground current path from said plate walls to said second pc board, said second conductive ring minimizing differential in signal path length of said ground current relative to said first current at a junction between the transmission line and the signal path at the second pc board, said second ground current path minimizing power loss at said junction.

10. The apparatus of claim 9, in which said conductive plate serves as a common ground path and ground reference for ground planes at pc boards in contact with said first and second surfaces.

11. An interconnection assembly for high frequency communication in the gigahertz frequency range, comprising:

an integral conductive plate having first and second elongated surfaces, said first surface defining a first recessed area, the plate having a through-channel between said first recessed area and said second surface defined by plate walls;

an insulating member received into said through-channel, the insulating member defining a central channel;

a conductive member received into the central channel of the insulating member;

a first pc board mounted to said first surface, the first pc board having an undersurface adjacent to said first surface serving as a pc board ground plane, a first signal being generated at said first board for off-board transmission;

a second pc board mounted to said second surface, the second pc board having an undersurface adjacent to said second surface serving as a pc board ground plane; and a first conductive ring received into said first recessed area, the first ring having a plurality of inwardly extending first radial fingers, each finger defining a first contact and a second contact, the first contact providing physical communication with the first pc board, the second contact providing physical communication with the plate; and wherein said conductive member, insulating member and plate walls at said through channel form a transmission line with impedance matched to impedance of a first pc board signal path at said first pc board carrying said first signal, said first pc board signal path coupled to said conductive member, said conductive member coupled to a second pc board signal path, said first signal received at said second pc board via the transmission line, said first signal having a first current travelling along said conductive member and an opposite ground current travelling along said plate walls; and wherein said first conductive ring receives said ground current and serves as a first ground current path from said plate walls to said first pc board, said first conductive ring minimizing differential in signal path length of said ground current relative to said first current at a junction between the transmission line and the signal path at the first pc board, said first ground current path minimizing power loss at said junction.

12. The apparatus of claim 11, in which said conductive plate serves as a common ground path for ground planes at pc boards in contact with said first and second surfaces.

13. The apparatus of claim 12, in which said conductive plate serves as a ground reference plane for pc boards in contact with said first and second surfaces.

14. The assembly of claim 11, wherein geometries of the insulating member and conductive member define a low pass filter.

15. The apparatus of claim 14, wherein the conductive member is a solid pin comprising:

first and second cylindrical end portions for coupling to the first pc board and the one of either a second pc board or component;

first, second, and third cylindrical middle portions axially aligned between the respective end portions, the first and third middle portions positioned on opposite ends of the second middle portion, the first and third middle portions having a larger diameter than the first and second end portions and the second middle portion.

16. The assembly of claim 11, wherein each first radial finger extends along a first plane and bends out of the first plane to define the first contact and bends back from the first contact toward the first plane to define the second contact.

17. The assembly of claim 11, wherein said plate is uniformly conductive throughout the plate's volume.

* * * * *